United States Patent [19]
Hunt et al.

[11] Patent Number: 6,087,858
[45] Date of Patent: *Jul. 11, 2000

[54] SELF-TIMED SENSE AMPLIFIER EVALUATION SCHEME

[75] Inventors: Jeffery Scott Hunt, Ackerman; Satish C. Saripella, Starkville, both of Miss.

[73] Assignee: Cypress Semiconductor Corp., San Jose, Calif.

[*] Notice: This patent is subject to a terminal disclaimer.

[21] Appl. No.: 09/103,960

[22] Filed: Jun. 24, 1998

[51] Int. Cl.$^7$ ............................................. H03K 19/013
[52] U.S. Cl. ................................. 327/18; 327/51; 327/52
[58] Field of Search ................................. 327/538, 540, 327/541, 543, 172, 175, 134, 108, 109, 427, 52, 18, 20, 51; 365/227

[56] References Cited

U.S. PATENT DOCUMENTS

| | | | |
|---|---|---|---|
| 4,922,461 | 5/1990 | Hayakawa et al. | 365/230.08 |
| 4,972,374 | 11/1990 | Wang et al. | 365/205 |
| 5,193,076 | 3/1993 | Houston | 365/233.5 |
| 5,291,447 | 3/1994 | Kodama et al. | 365/190 |
| 5,309,395 | 5/1994 | Dickinson et al. | 365/189.04 |
| 5,325,337 | 6/1994 | Buttar | 365/210 |
| 5,388,075 | 2/1995 | Vinal | 365/189.05 |
| 5,394,361 | 2/1995 | Dickinson | 365/189.04 |
| 5,473,565 | 12/1995 | Kusakari | 365/189.01 |
| 5,473,568 | 12/1995 | Okamura | 365/210 |
| 5,479,374 | 12/1995 | Kobayashi et al. | 365/233.5 |
| 5,502,681 | 3/1996 | Park | 365/210 |
| 5,544,101 | 8/1996 | Houston | 365/189.02 |
| 5,559,752 | 9/1996 | Stephens, Jr. et al. | 365/233 |
| 5,596,539 | 1/1997 | Passow et al. | 365/210 |
| 5,604,705 | 2/1997 | Ackland et al. | 365/205 |
| 5,610,862 | 3/1997 | Teel | 365/189.05 |
| 5,625,595 | 4/1997 | Ikeda | 365/194 |
| 5,644,773 | 7/1997 | DiMarco | 395/750 |
| 5,659,513 | 8/1997 | Hirose et al. | 365/205 |
| 5,661,417 | 8/1997 | Kondoh | 365/87 |
| 5,661,691 | 8/1997 | Lin | 365/208 |
| 5,703,831 | 12/1997 | Sawada | 365/233 |
| 5,717,653 | 2/1998 | Suzuki | 365/233 |
| 5,724,287 | 3/1998 | Takenaka | 365/191 |
| 5,729,503 | 3/1998 | Manning | 365/233.5 |
| 5,742,552 | 4/1998 | Greenberg | 365/210 |
| 5,745,419 | 4/1998 | Brauch | 365/201 |
| 5,748,544 | 5/1998 | Hashimoto | 365/201 |
| 5,751,170 | 5/1998 | Pyeon | 327/57 |
| 5,752,270 | 5/1998 | Wada | 711/169 |
| 5,754,481 | 5/1998 | Yabe et al. | 365/189.05 |
| 5,757,718 | 5/1998 | Suzuki | 365/233.5 |
| 5,761,136 | 6/1998 | Park et al. | 365/191 |
| 5,781,041 | 7/1998 | Lee et al. | 327/51 |
| 5,920,208 | 7/1999 | Park | 327/54 |

OTHER PUBLICATIONS

Jeffrey S. Hunt et al., U.S.S.N. 09/107,000 Method, Architecture and Circuit for Writing to and Reading From a Memory During a Single Cycle, filed Jun. 29, 1998.

Jeffrey S. Hunt et al., U.S.S.N. 09/106,806 Method, Architecture and Circuit for Writing to a Memory, filed Jun. 29, 1998.

Jeffrey S. Hunt et al., U.S.S.N. 09/132,100 Method, Architecture and Circuit for Reducing and/or Eliminating Small Signal Voltage Swing Sensitivity, filed Aug. 10, 1998.

Satish Saripella et al., U.S.S.N. 09/126,832 Worldline Synchronized Reference Voltage Generator, filed Jul. 31, 1998.

Primary Examiner—Terry D. Cunningham
Assistant Examiner—Anh-Quan Tra
Attorney, Agent, or Firm—Christopher P. Maiorana, P.C.

[57] ABSTRACT

A circuit and method for generating an evaluation signal used to turn OFF one or more sense amplifiers. The sense amplifiers may be configured to present a first and second output in response to (i) an input signal and (ii) an enable signal. A detect circuit may be configured to present a detect signal in response to the first and second outputs. A control circuit may be configured to present the enable signal in response to (i) the detect signal and (ii) a wordline signal.

20 Claims, 5 Drawing Sheets

SELF-TIMED SENSE AMPLIFIER EVALUATION SCHEME

FIELD OF THE INVENTION

The present invention relates to sense amplifiers generally and, more particularly, to a sense amplifier that may provide an evaluation signal to turn off the sense amplifier after an input signal has been sensed.

BACKGROUND OF THE INVENTION

Conventional approaches for enabling sense amplifiers generally involve turning ON a sense amplifier after an address transition detection has occurred, waiting a predetermined time and then turning OFF the sense amplifier. The predetermined time is generally a fixed delay, which must be designed prior to fabrication of the device and must accommodate voltage, temperature and process variations. The delay is generally longer than required in order to provide enough margin for proper operation of the sense amplifier under worst case conditions. As a result, the sense amplifier may be left ON for a longer time than is necessary.

Referring to FIG. 1 a circuit 10 is shown implementing a sense amplifier in the context of a memory array. The circuit 10 comprises an address path block 12, a memory array block 14, a sense amplifier block 16, an output path block 18, an address transition detection block 20 and a control block 22. The address path block 12 and the address transition detection block 20 each receive an external address signal. The address transition detection block 20 presents an address transition detect signal (ATD) to the control block 22. The control block 22 presents a signal WL_ENABLE to the address path block 12. The address path block 12 presents a signal WL to the memory array block 14. The memory array block 14 presents a signal WL_DETECT to the control block 22 as well as a signal TBUS to the sense amplifier block 16. The sense amplifier block 16 presents a signal SA_OUT to the output path block 18. The output path block 18 presents a signal OUTPUT representing data read from the memory array block 14. The control block 22 presents a signal SA_ENABLE to the sense amplifier block 16 that is a fixed width pulsed delay. The pulsed delay is a fixed delay based on the worst case conditions allowing enough time for the sense amplifier block 16 to properly sense the signals received from the memory array block 14. The sense amplifier block 16 can comprise a number of sense amplifiers that may each be controlled by the pulsed delay presented by the control block 22. Since a number of sense amplifiers can be controlled by the same signal SA_ENABLE, the length of the pulsed delay is generally increased to ensure proper margin for sensing of the slowest sense amplifier.

Referring to FIG. 2, a timing diagram illustrating the various signals of FIG. 1 is shown. The address signals presented to the address path block 12 and the address transition detection block 20 are shown having a transition 30. The signal ATD presents a pulse 32 in response to an external address transition. The signal WL_ENABLE has a positive transition 34 that responds to the pulse 32 of the signal ATD. The signal WL_ENABLE generally remains high until the end of the signal SA_ENABLE. The signal WL responds to the transition of the signal WL_ENABLE by adding a positive transition 36. The signal WL remains high as long as the signal WL_ENABLE remains high. The signal WL_DETECT has a positive transition 38 that responds to the positive transition 36 of the signal WL. The signal SA_ENABLE has a positive transition 42 that responds to the positive transition 38 of the signal WL_DETECT. The signal TBUS has a transition 39 that also responds to the positive transition 36 of the signal WL. The signal SA_OUT has a transition 40 that responds to the positive transition 42 of the signal SA_ENABLE and indicates the sense amplifiers have evaluated the contents of the memory array block 14.

The signal SA_ENABLE generally remains high for a fixed delay indicated as "pulsed delay". During the pulsed delay, the sense amplifier begins sensing of the signals received from the memory array block 14. The beginning of this sensing is indicated by the vertical line 44. The vertical line 46 indicates the end of the actual time the sense amplifiers are sensing, which is indicated by the transition 40. The time between the vertical line 44 and the vertical line 46 represents a portion of the pulsed delay where the sense amplifiers are actually sensing the signal. The pulsed delay has a negative transition 48 that occurs after the fixed and predetermined delay. A vertical line 50 represents a time when the sense amplifiers actually turn OFF. The time between the vertical line 46 and the vertical line 50 represents a time when the sense amplifiers are active, but do not provide any meaningful function, since the outputs have already changed at the transition 40. During this unproductive time, the sense amplifiers continue to use unneeded current, which is generally undesirable. The signal WL_ENABLE has a negative transition 52 that responds to the negative transition 48 of the signal SA_ENABLE. The signal SA_OUT has a transition 53 that responds to the negative transition 48. The signal WL has a negative transition 54 that responds to the negative transition 52 of the signal WL_ENABLE. The signal WL_DETECT has a negative transition 56 that responds to the negative transition 54 of the signal WL. The signal TBUS has a transition 57 that responds to the transition 54 of the signal WL. The signal OUTPUT has a transition 59 that responds to the end of the sense amplifier at the vertical line 46.

Referring to FIG. 3, a block diagram of the control block 22 is shown. The signal WL_DETECT is presented to a pulsed delay block 60 that presents the signal SA_ENABLE. The pulse generator block 62 responds to a negative transition of the signal SA_ENABLE and presents a pulse to a reset input of an SR latch 64. The signal ATD is presented to the set input of the SR latch 64. The Q output of the SR latch 64 presents the signal WL_ENABLE.

Referring to FIG. 4, the pulsed delay block 60 is shown in greater detail comprising a number of inverters 66a–66n and a gate 68. The amount of delay generally depends on a number of inverters 66a–66n. FIG. 5 illustrates a more detailed diagram of the pulse generator block 62 comprising a number of inverters 70a–70n and a gate 72. Similar to the pulsed delay block 60, the number of inverters 70a–70n generally controls the amount of delay at the output. The type of gate (i.e., the gate 68 or the gate 72) generally controls whether the delayed pulse is a positive or negative edge triggered device. Since the pulsed delay block 60 has an AND gate, a positive edge-triggered device results. Similarly, since the pulse generator block 62 has a NOR gate 72, a negative edge-triggered device results.

Since both the pulsed delay block 60 and the pulse generator block 62 each comprise a number of inverters 66a–66n and 70a–70n, used as delay elements, the amount of delay presented by the signal SA_ENABLE is a predetermined delay, with the inherent disadvantages discussed previously.

SUMMARY OF THE INVENTION

The present invention concerns a circuit and method for generating an evaluation signal used to turn OFF one or more sense amplifiers. The sense amplifiers may be configured to present a first and second output in response to (i) an input signal and (ii) an enable signal. A detect circuit may be configured to present a detect signal in response to the first and second outputs. A control circuit may be configured to present the enable signal in response to (i) the detect signal and (ii) a wordline signal.

The objects, features and advantages of the present invention include providing a circuit that may provide an evaluation signal that may turn OFF a sense amplifier after an input signal has been sensed. The sense amplifier may use a minimum amount of current by turning OFF after a signal has been sensed.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
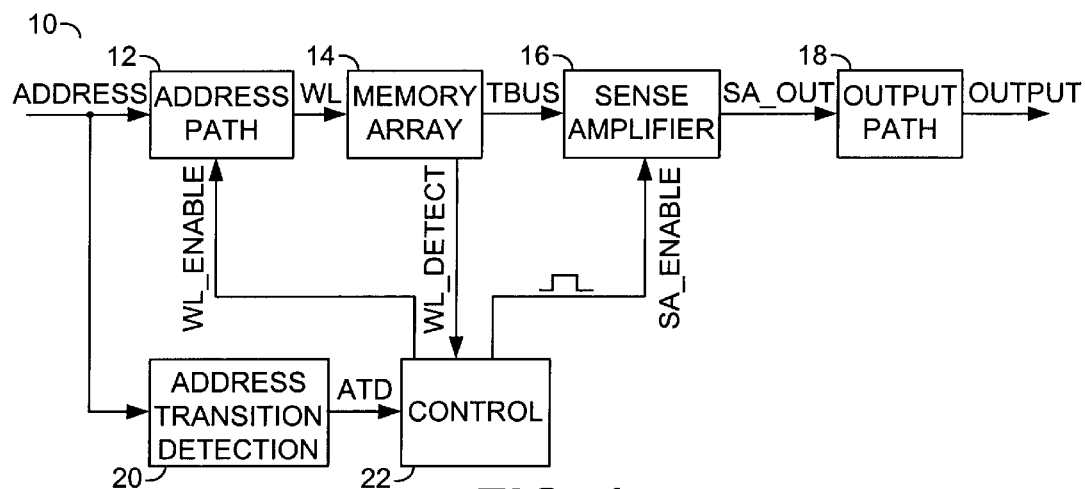
FIG. 1 is a block diagram of a conventional approach implementing a sense amplifier in the context of a memory array.
Figure 2:
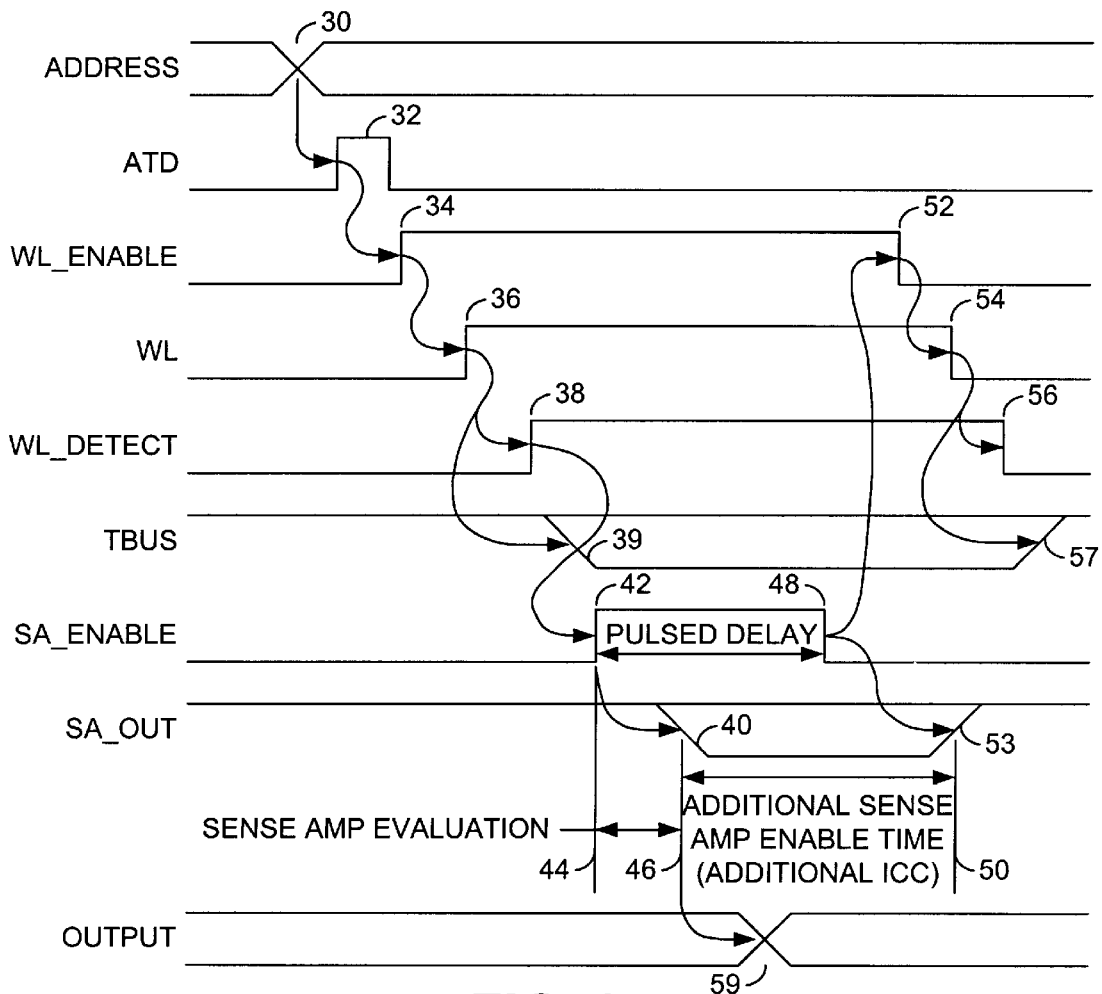
FIG. 2 is a timing diagram of the various signals of FIG. 1.
Figure 3:
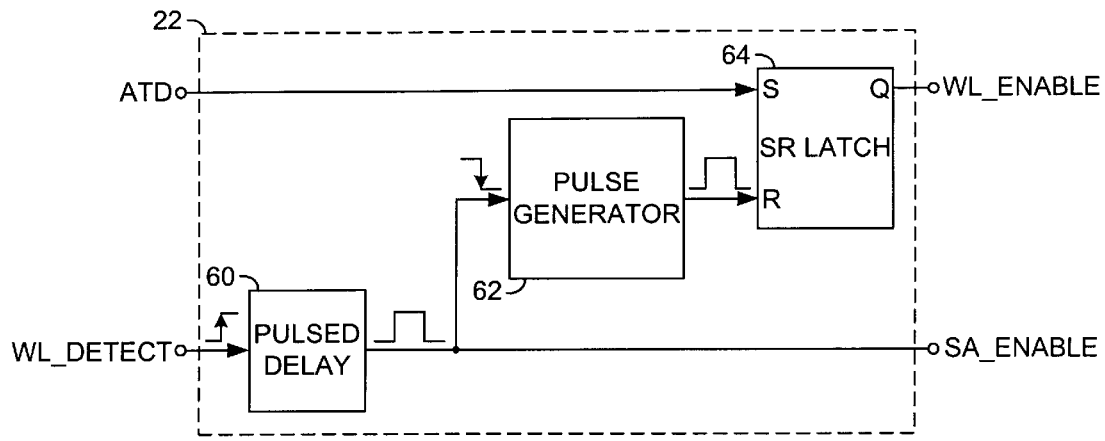
FIG. 3 is a block diagram of the control block of FIG. 1.
Figure 4:
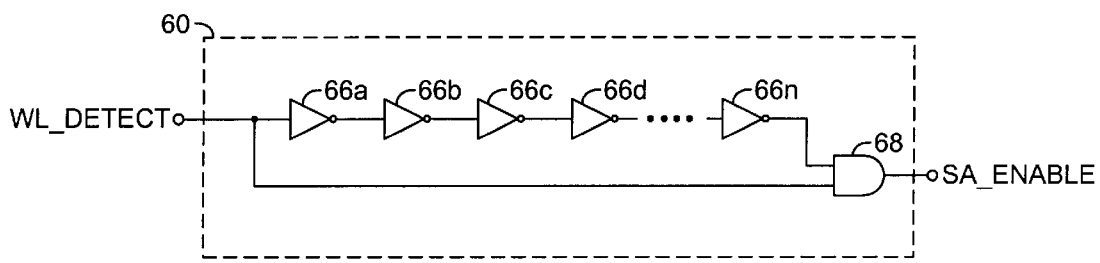
FIG. 4 is a circuit diagram of the pulsed delay block of FIG. 3.
Figure 5:
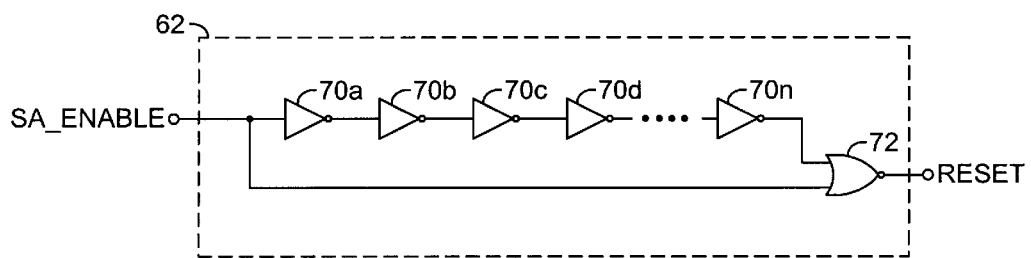
FIG. 5 is a circuit diagram of the pulse generator of FIG. 3.
Figure 6:
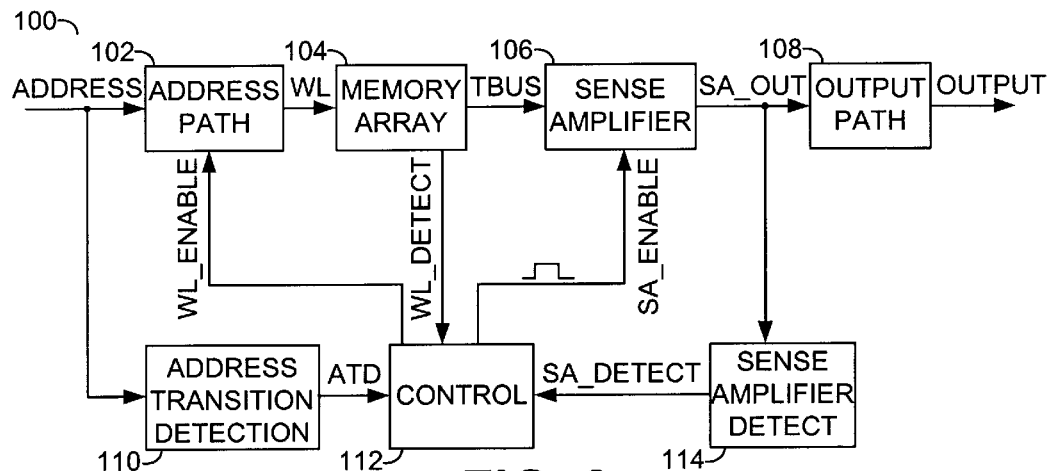
FIG. 6 is a block diagram of a preferred embodiment of the present invention.

Referring to FIG. 6, a circuit 100 is shown implementing a preferred embodiment of the present invention. The circuit 100 generally comprises an address path block (or circuit) 102, a memory array block (or circuit) 104, a sense amplifier block (or circuit) 106, an output path block (or circuit) 108, an address transition detection (ATD) block (or circuit) 110, a control block (or circuit) 112 and a sense amplifier detect block (or circuit) 114. The address path block 102, the memory array block 104 and the address transition detection block 110 generally present a number of signals (e.g., a signal WL, a signal TBUS, a signal WL_DETECT, a signal WL_ENABLE, and a signal ATD) in a similar fashion to the conventional approach described in connection with FIG. 1. The sense amplifier detect block 114 generally presents a signal (e.g., SA_DETECT) in response to a signal (SA_OUT) that may be presented by the sense amplifier block 106. The signal SA_OUT may comprise a first and a second output (to be illustrated in more detail in connection with FIG. 7). The control block 112 generally presents an enable signal (e.g., SA_ENABLE) to the sense amplifier block 106 in response to the signal ATD, the signal WL_DETECT and the signal SA_DETECT. The signal SA_ENABLE is generally asserted after the signal WL_DETECT is asserted, but only until the signal SA_OUT evaluates the signal received from the memory array block 104. As a result, the sense amplifier block 106 may be turned OFF in a shorter time when compared to conventional approaches, which generally reduces the overall current consumed by the sense amplifier block 106. The signal SA_DETECT may shut down access to the memory array block 16, which may also eliminate additional current.

Figure 7:
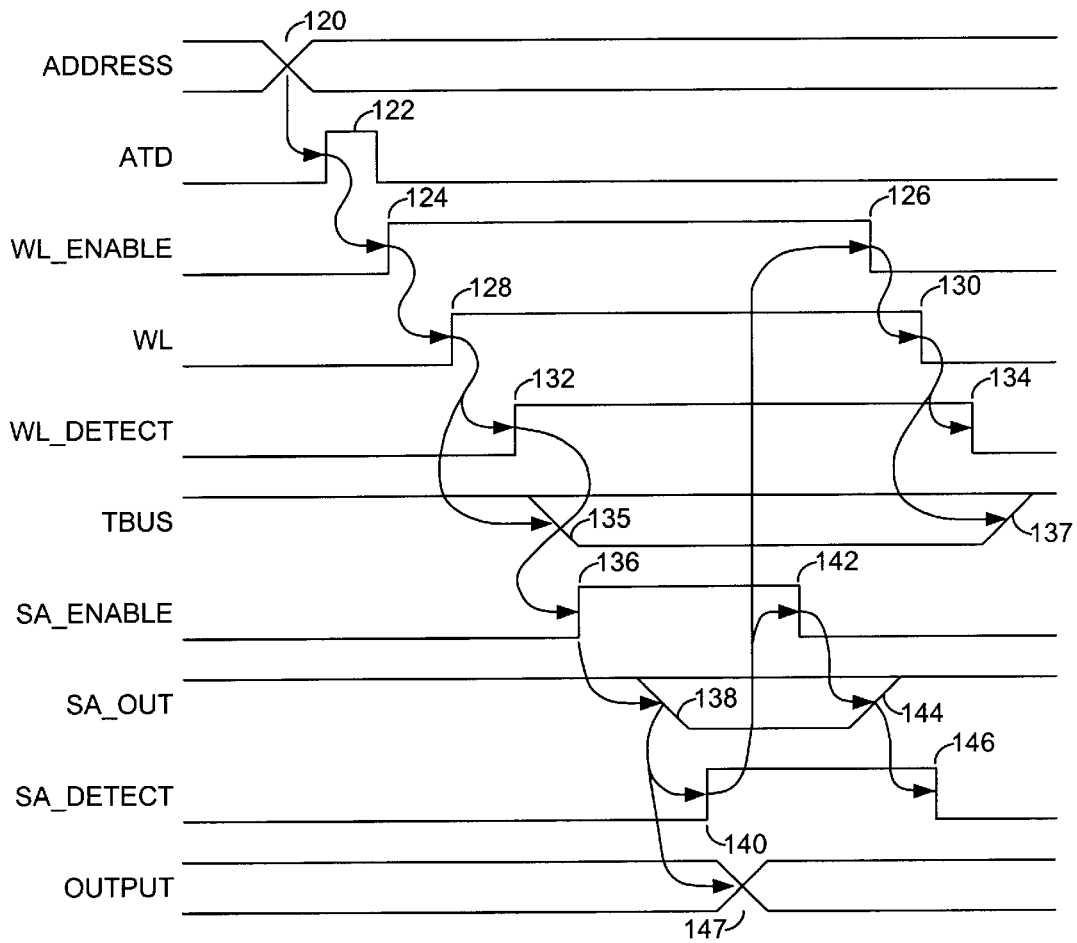
FIG. 7 is a timing diagram of the signals of FIG. 6.

Referring to FIG. 7, a timing diagram of the various signals of FIG. 6 is shown. The address generally transitions at a time 120, which generally provides a positive transition 122 of the address transition detection signal (ATD). The signal ATD generally provides a pulse that generates a positive transition 124 of the signal WL_ENABLE. The signal WL_ENABLE generally remains high until a negative transition 126 that may respond to the signal SA_DETECT. The signal WL generally has a positive transition 128 that may respond to the positive transition 124 of the signal WL_ENABLE. The signal WL generally remains high until a negative transition 130 that may respond to the negative transition 126 of the signal WL_ENABLE. The signal WL_DETECT generally has a positive transition 132 that may respond to the positive transition 128 of the signal WL. The signal WL_DETECT generally remains high until a negative transition 134, which generally responds to the negative transition 130 of the signal WL. The signal TBUS generally has a transition 135 that may respond to the positive transition 128 of the signal WL. The signal TBUS generally has a transition 137 that may respond to the negative transition 130 of the signal WL. The signal SA_ENABLE may have a positive transition 136 that may respond to the positive transition 132 of the signal WL_DETECT. The signal SA_ENABLE generally remains high until the sense amplifier block 106 senses the signals received from the memory array block 104. The signal SA_OUT has a transition 138 that may indicate the signal received from the memory array block 104 has been sensed. The signal SA_DETECT generally has a positive transition 140 that may respond to the transition 138 of the signal SA_OUT. The positive transition 140 of the signal SA_DETECT generally triggers a negative transition 142 of the signal SA_ENABLE. The negative transition of the signal SA_ENABLE generally turns OFF the sense amplifier block 106 and may provide a transition 144 of the signal SA_OUT. The signal SA_DETECT generally has a negative transition 146 that responds to the transition 144 of the signal SA_OUT. The transition 140 generally occurs in response to the transition 138. Similarly, the transition 142 generally occurs in response to the transition 140. The time between the transition 136 and the transition 142 of the signal SA_ENABLE generally indicates a time the sense amplifiers are ON to ensure the information from the memory array block 104 is properly sensed. The signal OUTPUT has a transition 147 that generally occurs in response to the transition 138 of the signal SA_OUT.

Figure 8:
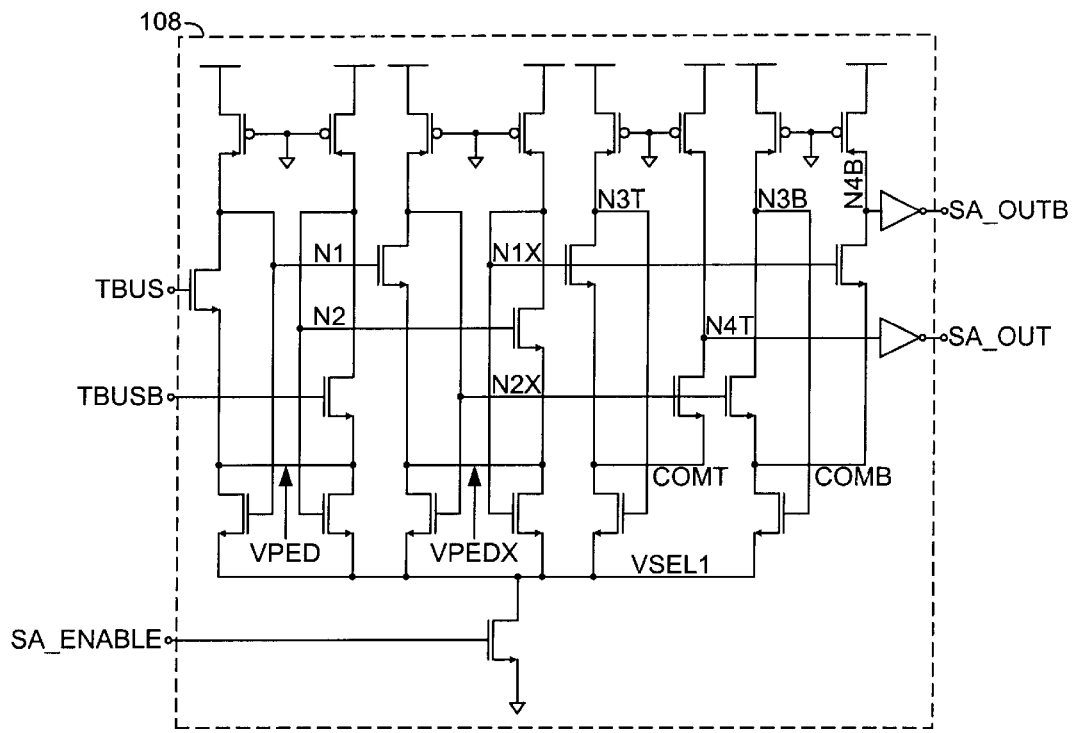
FIG. 8 is a circuit diagram of a typical sense amplifier that may be used in the context of the present invention.

Referring to FIG. 8, a circuit diagram of the portion of the sense amplifier block 106 is shown. FIG. 8 generally shows one sense amplifier of the sense amplifier block 106. However, the sense amplifier block 106 generally comprises a number of individual sense amplifiers. The particular number of sense amplifiers may be implemented to meet the design criteria of a particular application. However, when the sense amplifier is disabled (which may be controlled by the signal SA_ENABLE), both of the outputs generally transition to the same state. Furthermore, the circuit diagram of FIG. 8 illustrates one example of a sense amplifier that may be used in the context of the present invention. Other sense amplifiers may be implemented accordingly to meet the design criteria of a particular application. An example of a sense amplifier used in the sense amplifier block 106 may be found in co-pending application Ser. No. 08/764,027, filed Dec. 12, 1996, which is hereby incorporated by reference in its entirety.

Figure 9:
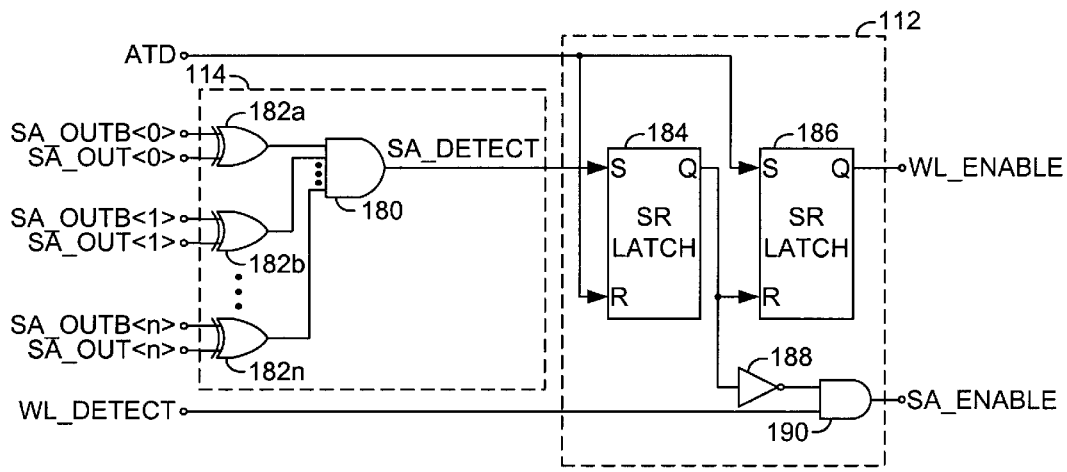
FIG. 9 is a block diagram of the control block and the detect block of FIG. 6.

Referring to FIG. 9, a more detailed diagram of the control block 112 and the sense amplifier detect block 114 is shown. The sense amplifier detect block 114 generally comprises a gate 180 and a number of gates 182a–182n. The gate 180 may be implemented as an AND gate and the gates 182a–182n may be implemented as exclusive OR gates. The gates 182a–182n may receive the signals SA_OUT and SA_OUTB from the various sense amplifiers 106. The gates 182a–182n may present a "1" when either the signal SA_OUT or the signal SA_OUTB is a "1", but not both signals being at a "1". When each of the gates 182a–182n presents a "1", the gate 180 may present a "1".

The control block 112 generally comprises a latch 184, a latch 186, an inverter 188 and a gate 190. The latch 184 may receive the signal ATD at a reset input and the latch 186 may receive the signal ATD at a set input. The signal SA_DETECT presented by the gate 180 may be presented to the set input of the latch 184. The output of the latch 184 may be presented to the reset input of the latch 186 as well as to an input of the gate 190 through the inverter 188. The signal WL_DETECT may be presented to another input of the gate 190. The latch 186 may present the signal WL_ENABLE and the gate 190 may present the signal SA_ENABLE.

Figure 10:
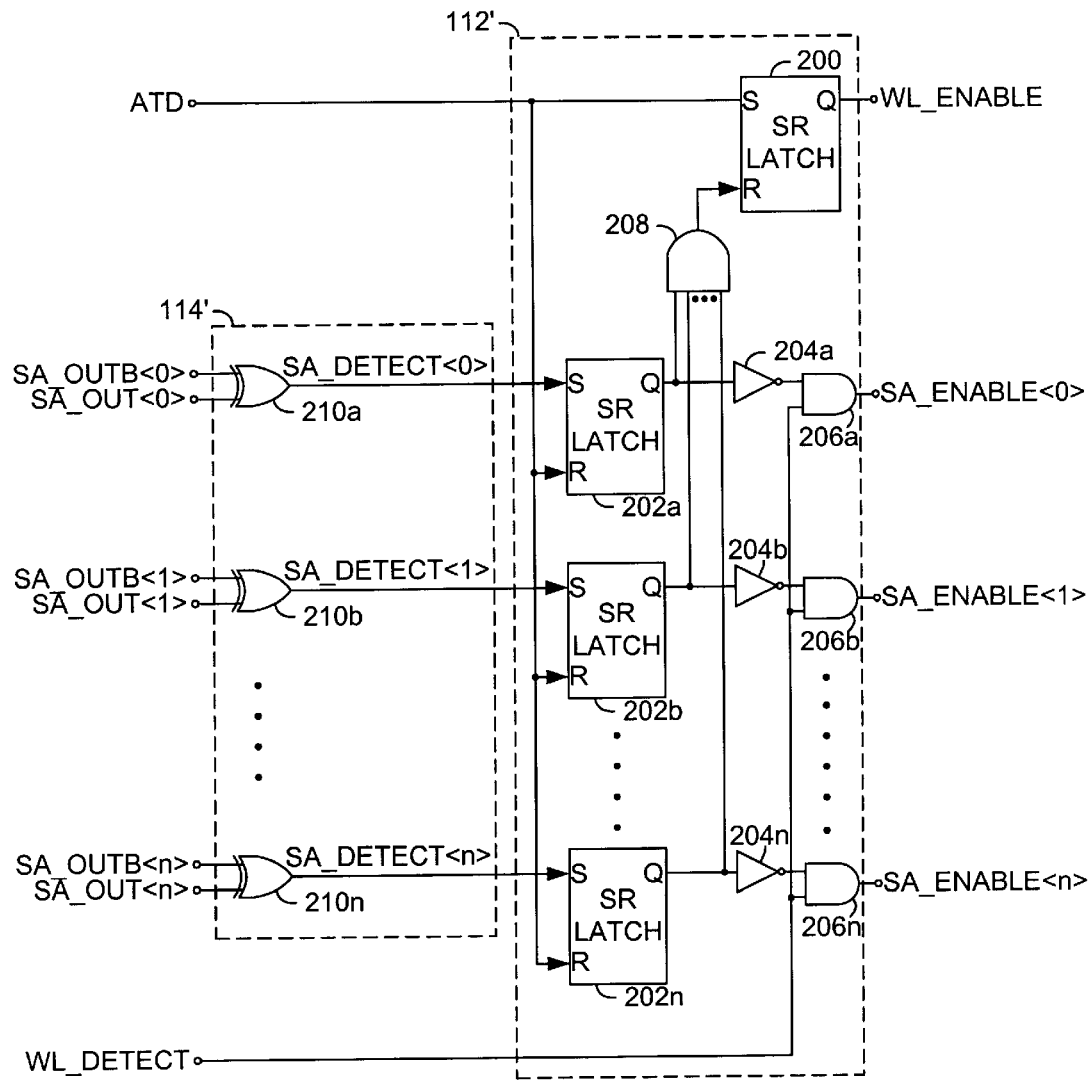
FIG. 10 is an alternate implementation of the control block and the detect block of FIG. 6.

Referring to FIG. 10, a more detailed diagram of an alternate implementation of the control block 112' and the sense amplifier detect block 114' is shown. The control block 112' generally comprises a latch 200, a number of latches 202a–202n, a number of inverters 204a–204n, a number of gates 206a–206n and a gate 208. Each of the gates 206a–206n may present an independent sense amplifier enable signal SA_ENABLE <0–n> that may each be presented to a number of independent sense amplifiers. A global wordline enable signal WL_ENABLE is generally presented by the latch 200. The global wordline enable signal WL_ENABLE may wait for the sense amplifier enable signals SA_ENABLE <0–n> to indicate that all of the sense amplifiers of sense amplifier block 106 have sensed the data from the memory array block 104 before disabling the wordline. The sense amplifier detect block 114' generally comprises a number of gates 210a–210n that present a number of sense amplifier detect signals SA_DETECT <0–n>. The alternate implementation shown in FIG. 10 allows the individual sense amplifiers to turn OFF when they are finished sensing data from the memory array, but prior to the wordline being turned OFF by the signal WL_ENABLE. This may allow for additional current savings.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a sense amplifier configured to present a first output and a second output in response to (i) an input signal and (ii) an enable signal;
   a detect circuit configured to present a first detect signal in response to said first and second outputs; and
   a control circuit configured to present said enable signal in response to (i) said first detect signal, (ii) a wordline signal and (iii) a second detect signal.

2. The circuit according to claim 1, wherein said first detect signal is generated when said first and said second outputs are at different states.

3. The circuit according to claim 2, wherein said detect circuit comprises a sense amplifier detect circuit.

4. The circuit according to claim 1, wherein said enable signal has a first state that enables said sense amplifier and a second state that disables said sense amplifier.

5. The circuit according to claim 1, further comprising a plurality of sense amplifiers each having a first and a second sense amplifier output.

6. The circuit according to claim 5, wherein said detect circuit presents said first detect signal in response to each of said first and second sense amplifier outputs having a different state.

7. The circuit according to claim 5, wherein said detect circuit presents a plurality of first detect signals, each in response to one of said sense amplifier outputs.

8. The circuit according to claim 1, wherein said input signal is generated from a memory array.

9. The circuit according to claim 1, wherein said second detect signal is generated in further response to a transition of an externally generated address.

10. A circuit comprising:
    means for generating a first and a second output in response to (i) an input signal and (ii) an enable signal;
    means for generating a first detect signal in response to said first and second outputs; and
    means for generating said enable signal in response to (i) said first detect signal, (ii) a wordline signal and (iii) a second detect signal.

11. A method for enabling and disabling a sense amplifier comprising the steps of:
    (A) generating a first and a second sense amplifier output in response to (i) an input signal and (ii) an enable signal;
    (B) generating a first detect signal in response to said first and second sense amplifier outputs; and
    (C) generating said enable signal in response to (i) said first detect signal, (ii) a wordline signal and (iii) a second detect signal.

12. The method according to claim 11, wherein said first detect signal is generated when said first and said second sense amplifier outputs are at different states.

13. The method according to claim 12, wherein said first detect signal is generated by a sense amplifier detect circuit.

14. The method according to claim 11, wherein said enable signal has a first state that enables said sense amplifier and a second state that disables said sense amplifier.

15. The method according to claim 11, wherein step (A) generates a plurality of said first and second sense amplifier outputs.

16. The method according to claim 15, wherein step (B) generates a plurality of said first detect signals, each in response to one of said first and second sense amplifier outputs being at a different state.

17. The method according to claim 15, wherein step (B) generates said first detect signal in response to each of said first and second sense amplifier outputs having an active state.

18. The circuit according to claim 1, wherein said second detect signal comprises an address transition detect signal.

19. The circuit according to claim 10, wherein said second detect signal comprises an address transition detect signal.

20. The method according to claim 11, wherein said second detect signal comprises an address transition detect signal.

* * * * *